US011309012B2

(12) United States Patent
Meier et al.

(10) Patent No.: US 11,309,012 B2
(45) Date of Patent: *Apr. 19, 2022

(54) APPARATUSES AND METHODS FOR STAGGERED TIMING OF TARGETED REFRESH OPERATIONS

(71) Applicant: MICRON TECHNOLOGY, INC., Boise, ID (US)

(72) Inventors: Nathaniel J. Meier, Boise, ID (US); James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/187,002

(22) Filed: Feb. 26, 2021

(65) Prior Publication Data

US 2021/0183435 A1    Jun. 17, 2021

Related U.S. Application Data

(63) Continuation of application No. 16/375,716, filed on Apr. 4, 2019, now Pat. No. 11,227,649.

(51) Int. Cl.
*G11C 11/406* (2006.01)
*G11C 11/408* (2006.01)

(52) U.S. Cl.
CPC ...... *G11C 11/40618* (2013.01); *G11C 11/408* (2013.01); *G11C 11/40615* (2013.01); *G11C 11/40622* (2013.01)

(58) Field of Classification Search
CPC ........ G11C 11/40618; G11C 11/40622; G11C 11/408; G11C 11/40615; G11C 11/40611
(Continued)

(56) References Cited

U.S. PATENT DOCUMENTS 5,299,159 A    3/1994  Balistreri et al.
5,654,929 A    8/1997  Mote, Jr.
(Continued)

FOREIGN PATENT DOCUMENTS

CN    101038785 A    9/2007
CN    101067972 A    11/2007
(Continued)

OTHER PUBLICATIONS

Intellectual Property Management Inc.
(Continued)

*Primary Examiner* — Michael T Tran
(74) *Attorney, Agent, or Firm* — Dorsey & Whitney LLP

(57) ABSTRACT

Embodiments of the disclosure are drawn to apparatuses and methods for staggering the timing of targeted refresh operations. A memory device may include a number of memory banks, at least some of which may be simultaneously entered into a refresh mode. A given memory bank may perform an auto-refresh operation or a targeted refresh operation, which may draw less power than the auto-refresh operation. The timing of the targeted refresh operations may be staggered between the refreshing memory banks, such that a portion of the refreshing memory banks are performing a targeted refresh operation simultaneously with a portion of the refreshing memory banks performing an auto-refresh operation.

20 Claims, 5 Drawing Sheets

(58) Field of Classification Search
USPC .......................................... 365/222, 230.06
See application file for complete search history.

(56) References Cited

U.S. PATENT DOCUMENTS

| | | | |
|---|---|---|---|
| 5,699,297 A | 12/1997 | Yamazaki et al. | |
| 5,867,442 A | 2/1999 | Kim et al. | |
| 5,933,377 A | 8/1999 | Hidaka | |
| 5,943,283 A | 8/1999 | Wong et al. | |
| 5,956,288 A | 9/1999 | Bermingham et al. | |
| 5,959,923 A | 9/1999 | Matteson et al. | |
| 5,970,507 A | 10/1999 | Kato et al. | |
| 5,999,471 A | 12/1999 | Choi | |
| 6,002,629 A | 12/1999 | Kim et al. | |
| 6,011,734 A | 1/2000 | Pappert | |
| 6,061,290 A | 5/2000 | Shirley | |
| 6,064,621 A | 5/2000 | Tanizaki et al. | |
| 6,212,118 B1 | 4/2001 | Fujita | |
| 6,306,721 B1 | 10/2001 | Teo et al. | |
| 6,310,806 B1 | 10/2001 | Higashi et al. | |
| 6,310,814 B1 | 10/2001 | Hampel et al. | |
| 6,363,024 B1 | 3/2002 | Fibranz | |
| 6,392,952 B1 | 5/2002 | Chen et al. | |
| 6,424,582 B1 | 7/2002 | Ooishi | |
| 6,434,064 B2 | 8/2002 | Nagai | |
| 6,452,868 B1 | 9/2002 | Fister | |
| 6,515,928 B2 | 2/2003 | Sato et al. | |
| 6,535,950 B1 | 3/2003 | Funyu et al. | |
| 6,567,340 B1 | 5/2003 | Nataraj et al. | |
| 6,950,364 B2 | 9/2005 | Kim | |
| 7,002,868 B2 | 2/2006 | Takahashi | |
| 7,057,960 B1 | 6/2006 | Fiscus et al. | |
| 7,082,070 B2 | 7/2006 | Hong | |
| 7,187,607 B2 | 3/2007 | Koshikawa et al. | |
| 7,203,113 B2 | 4/2007 | Takahashi et al. | |
| 7,203,115 B2 | 4/2007 | Eto et al. | |
| 7,209,402 B2 | 4/2007 | Shinozaki et al. | |
| 7,215,588 B2 | 5/2007 | Lee | |
| 7,444,577 B2 | 10/2008 | Best et al. | |
| 7,551,502 B2 | 6/2009 | Dono et al. | |
| 7,565,479 B2 | 7/2009 | Best et al. | |
| 7,692,993 B2 | 4/2010 | Iida et al. | |
| 7,830,742 B2 | 11/2010 | Han | |
| 8,174,921 B2 | 5/2012 | Kim et al. | |
| 8,400,805 B2 | 3/2013 | Yoko | |
| 8,572,423 B1 | 10/2013 | Isachar et al. | |
| 8,625,360 B2 | 1/2014 | Iwamoto et al. | |
| 8,681,578 B2 | 3/2014 | Narui | |
| 8,756,368 B2 | 6/2014 | Best et al. | |
| 8,811,100 B2 | 8/2014 | Ku | |
| 8,862,973 B2 | 10/2014 | Zimmerman et al. | |
| 8,938,573 B2 | 1/2015 | Greenfield et al. | |
| 9,032,141 B2 | 5/2015 | Bains et al. | |
| 9,047,978 B2 | 6/2015 | Bell et al. | |
| 9,076,499 B2 | 7/2015 | Schoenborn et al. | |
| 9,087,602 B2 | 7/2015 | Youn et al. | |
| 9,117,544 B2 | 8/2015 | Bains et al. | |
| 9,123,447 B2 | 9/2015 | Lee et al. | |
| 9,153,294 B2 | 10/2015 | Kang | |
| 9,190,137 B2 | 11/2015 | Kim et al. | |
| 9,190,139 B2 | 11/2015 | Jung et al. | |
| 9,236,110 B2 | 1/2016 | Bains et al. | |
| 9,251,885 B2 | 2/2016 | Greenfield et al. | |
| 9,286,964 B2 | 3/2016 | Halbert et al. | |
| 9,299,400 B2 | 3/2016 | Bains et al. | |
| 9,311,984 B1 | 4/2016 | Hong et al. | |
| 9,311,985 B2 | 4/2016 | Lee et al. | |
| 9,324,398 B2 | 4/2016 | Jones et al. | |
| 9,384,821 B2 | 7/2016 | Bains et al. | |
| 9,390,782 B2 | 7/2016 | Best et al. | |
| 9,396,786 B2 | 7/2016 | Yoon et al. | |
| 9,406,358 B1 | 8/2016 | Lee | |
| 9,412,432 B2 | 8/2016 | Narui et al. | |
| 9,418,723 B2 | 8/2016 | Chishti et al. | |
| 9,424,907 B2 | 8/2016 | Fujishiro | |
| 9,484,079 B2 | 11/2016 | Lee | |
| 9,514,850 B2 | 12/2016 | Kim | |
| 9,570,143 B2 | 2/2017 | Lim et al. | |
| 9,570,201 B2 | 2/2017 | Morgan et al. | |
| 9,646,672 B1 | 5/2017 | Kim et al. | |
| 9,653,139 B1 | 5/2017 | Park | |
| 9,672,889 B2 | 6/2017 | Lee et al. | |
| 9,685,240 B1 | 6/2017 | Park | |
| 9,691,466 B1* | 6/2017 | Kim ...................... G11C 11/408 |
| 9,697,913 B1 | 7/2017 | Mariani et al. | |
| 9,734,887 B1 | 8/2017 | Tavva | |
| 9,741,409 B2 | 8/2017 | Jones et al. | |
| 9,741,447 B2 | 8/2017 | Akamatsu | |
| 9,747,971 B2 | 8/2017 | Bains et al. | |
| 9,761,297 B1 | 9/2017 | Tomishima | |
| 9,786,351 B2 | 10/2017 | Lee et al. | |
| 9,799,391 B1 | 10/2017 | Wei | |
| 9,805,782 B1 | 10/2017 | Liou | |
| 9,805,783 B2 | 10/2017 | Ito et al. | |
| 9,812,185 B2 | 11/2017 | Fisch et al. | |
| 9,818,469 B1 | 11/2017 | Kim et al. | |
| 9,831,003 B2 | 11/2017 | Sohn et al. | |
| 9,865,326 B2 | 1/2018 | Bains et al. | |
| 9,865,328 B1 | 1/2018 | Desimone et al. | |
| 9,922,694 B2 | 3/2018 | Akamatsu | |
| 9,934,143 B2 | 4/2018 | Bains et al. | |
| 9,953,696 B2 | 4/2018 | Kim | |
| 9,978,430 B2 | 5/2018 | Seo et al. | |
| 10,020,045 B2 | 7/2018 | Riho | |
| 10,020,046 B1 | 7/2018 | Uemura | |
| 10,032,501 B2 | 7/2018 | Ito et al. | |
| 10,049,716 B2 | 8/2018 | Proebsting | |
| 10,083,737 B2 | 9/2018 | Bains et al. | |
| 10,090,038 B2 | 10/2018 | Shin | |
| 10,134,461 B2 | 11/2018 | Bell et al. | |
| 10,141,042 B1* | 11/2018 | Richter ............... G11C 11/4087 |
| 10,147,472 B2 | 12/2018 | Jones et al. | |
| 10,153,031 B2 | 12/2018 | Akamatsu | |
| 10,170,174 B1 | 1/2019 | Ito et al. | |
| 10,192,608 B2 | 1/2019 | Morgan | |
| 10,210,925 B2 | 2/2019 | Bains et al. | |
| 10,297,305 B1 | 5/2019 | Moon et al. | |
| 10,297,307 B1 | 5/2019 | Raad et al. | |
| 10,339,994 B2 | 7/2019 | Ito et al. | |
| 10,381,327 B2 | 8/2019 | Ramachandra et al. | |
| 10,446,256 B2 | 10/2019 | Ong et al. | |
| 10,468,076 B1 | 11/2019 | He et al. | |
| 10,490,250 B1 | 11/2019 | Ito et al. | |
| 10,490,251 B2 | 11/2019 | Wolff | |
| 10,504,577 B1 | 12/2019 | Alzheimer | |
| 10,510,396 B1 | 12/2019 | Notani et al. | |
| 10,572,377 B1 | 2/2020 | Zhang et al. | |
| 10,573,370 B2 | 2/2020 | Ito | |
| 10,607,679 B2 | 3/2020 | Nakaoka | |
| 10,685,696 B2 | 6/2020 | Brown et al. | |
| 10,699,796 B2 | 6/2020 | Benedict et al. | |
| 10,790,005 B1 | 9/2020 | He et al. | |
| 10,825,505 B2 | 11/2020 | Rehmeyer | |
| 10,832,792 B1 | 11/2020 | Penney et al. | |
| 10,930,335 B2 | 2/2021 | Bell et al. | |
| 10,943,636 B1 | 3/2021 | Wu et al. | |
| 10,950,289 B2 | 3/2021 | Ito et al. | |
| 10,957,377 B2 | 3/2021 | Noguchi | |
| 10,964,378 B2 | 3/2021 | Ayyapureddi et al. | |
| 10,978,132 B2 | 4/2021 | Rehmeyer et al. | |
| 11,017,833 B2 | 5/2021 | Wu et al. | |
| 11,069,393 B2 | 7/2021 | Cowles et al. | |
| 11,081,160 B2 | 8/2021 | Ito et al. | |
| 2001/0008498 A1 | 7/2001 | Ooishi | |
| 2002/0026613 A1 | 2/2002 | Niiro | |
| 2002/0181301 A1 | 12/2002 | Takahashi et al. | |
| 2002/0191467 A1 | 12/2002 | Matsumoto et al. | |
| 2003/0026161 A1 | 2/2003 | Yamaguchi et al. | |
| 2003/0063512 A1 | 4/2003 | Takahashi et al. | |
| 2003/0067825 A1 | 4/2003 | Shimano et al. | |
| 2003/0081483 A1 | 5/2003 | De Paor et al. | |
| 2003/0123301 A1 | 7/2003 | Jang et al. | |
| 2003/0161208 A1 | 8/2003 | Nakashima et al. | |
| 2003/0193829 A1 | 10/2003 | Morgan et al. | |

(56) References Cited

U.S. PATENT DOCUMENTS

| | | |
|---|---|---|
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Done et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0147154 A1 | 6/2007 | Lee |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1* | 10/2008 | Barth ................ G06F 13/28 711/105 |
| 2008/0306723 A1 | 12/2008 | De et al. |
| 2008/0316845 A1 | 12/2008 | Wang et al. |
| 2009/0021999 A1 | 1/2009 | Tanimura et al. |
| 2009/0052264 A1* | 2/2009 | Hong .............. G11C 29/50016 365/201 |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1* | 3/2010 | Yen .................. G11C 16/3431 365/185.25 |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1* | 5/2010 | Lee .................... G11C 8/10 365/222 |
| 2010/0128547 A1* | 5/2010 | Kagami ............ G11C 11/40622 365/222 |
| 2010/0131812 A1 | 5/2010 | Mohammad |
| 2010/0141309 A1 | 6/2010 | Lee |
| 2010/0157693 A1 | 6/2010 | Iwai et al. |
| 2010/0182862 A1* | 7/2010 | Teramoto .......... G11C 11/40611 365/222 |
| 2010/0182863 A1* | 7/2010 | Fukiage ............ G11C 11/40618 365/222 |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1* | 3/2013 | Lee .................... G11C 11/4091 365/203 |
| 2013/0173971 A1 | 7/2013 | Zimmerman |
| 2013/0254475 A1 | 9/2013 | Perego et al. |
| 2013/0279284 A1* | 10/2013 | Jeong .................. G11C 11/408 365/222 |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1* | 5/2014 | Kim .................. G11C 16/3418 711/103 |
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1* | 8/2014 | Yu .................... G11C 11/40603 365/222 |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1* | 1/2015 | Sriramagiri ....... G11C 11/40611 365/222 |
| 2015/0049566 A1* | 2/2015 | Lee .................... G11C 11/40622 365/222 |
| 2015/0049567 A1 | 2/2015 | Chi |
| 2015/0055420 A1 | 2/2015 | Bell et al. |
| 2015/0078112 A1 | 3/2015 | Huang |

(56) References Cited

U.S. PATENT DOCUMENTS

| | | |
|---|---|---|
| 2015/0085564 A1* | 3/2015 | Yoon .................. G11C 11/40615 365/149 |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1* | 4/2015 | Kim ........................ G11C 7/02 711/106 |
| 2015/0134897 A1 | 5/2015 | Sriramagiri et al. |
| 2015/0162064 A1* | 6/2015 | Oh ........................ G11C 11/406 365/222 |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1* | 7/2015 | Li ........................ G11C 11/406 365/222 |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1* | 12/2015 | Joo ........................ G11C 11/408 365/230.03 |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1* | 7/2016 | Shin .................. G11C 11/40622 365/222 |
| 2016/0202926 A1 | 7/2016 | Benedict |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0076779 A1 | 3/2017 | Bains et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0133108 A1* | 5/2017 | Lee ........................ G11C 11/408 |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Naie |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lal |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1* | 10/2019 | Shin ........................ G11C 11/408 |
| 2019/0348100 A1 | 11/2019 | Smith et al. |
| 2019/0348102 A1* | 11/2019 | Smith ............... G11C 11/40611 |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194056 A1 | 6/2020 | Sakurai et al. |
| 2020/0202921 A1 | 6/2020 | Morohashi et al. |

(56) References Cited

U.S. PATENT DOCUMENTS

| | | | |
|---|---|---|---|
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |

FOREIGN PATENT DOCUMENTS

| | | | |
|---|---|---|---|
| CN | 104350546 A | 2/2015 |
| CN | 106710621 A | 5/2017 |
| CN | 107871516 A | 4/2018 |
| JP | 2005-216423 A | 8/2005 |
| JP | 2011-258259 A | 12/2011 |
| JP | 4911510 B2 | 1/2012 |
| JP | 2013-004158 A | 1/2013 |
| JP | 62 81030 B1 | 1/2018 |
| WO | 2014120477 | 8/2014 |
| WO | 2015030991 A1 | 3/2015 |
| WO | 2017171927 A1 | 10/2017 |
| WO | 2019222960 A1 | 11/2019 |
| WO | 2020010010 A1 | 1/2020 |
| WO | 2020117686 A1 | 6/2020 |
| WO | 2020247163 A1 | 12/2020 |
| WO | 2020247639 A1 | 12/2020 |

OTHER PUBLICATIONS

Application No. PCT/US20/23689, titled "Semiconductor Device Having Cam That Stores Address Signals", dated Mar. 19, 2020.
U.S. Appl. No. 16/797,658, titles "Apparatuses and Methods for Controlling Refresh Operations", filed Feb. 21, 2020.
U.S. Appl. No. 16/805,197. titled "Apparatuses and Methods for Calculating Row Hammer Refresh Addresses in a Semiconductor Device", dated Feb. 28, 2020.
U.S. Appl. No. 16/268,818, titled "Apparatuses and Methods for Managing Row Access Counts", filed Feb. 6, 2019.
U.S. Appl. No. 16/358,587, titled "Semiconductor Device Having Cam That Stores Address Signals", dated Mar. 19, 2019.
U.S. Appl. No. 16/411,573 titled "Apparatuses, Systems, and Methods for a Content Addressable Memory Cell", filed May 14, 2019.
U.S. Appl. No. 16/428,625 titled "Apparatuses and Methods for Tracking Victim Rows" filed May 31, 2019.
U.S. Appl. No. 16/513,400 titled "Apparatuses and Methods for Tracking Row Accesses" filed Jul. 16, 2019.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.
U.S. Appl. No. 16/546,152 titled "Apparatuses and Methods for Analog Row Access Tracking" filed Aug. 20, 2019.
U.S. Appl. No. 15/881,256 entitled 'Apparatuses and Methods for Detecting a Row Hammer Attack With a Bandpass Filter' filed on Jan. 26, 2018.
U.S. Appl. No. 16/425,525 titled "Apparatuses And Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titied "Apparatuses, Systems, and Methods for Determining Extremum Numerical Values" filed Jun. 11, 2019.
U.S. Appl. No. 16/994,338 titled "Apparatuses, Systems, and Methods for Memory Directed Access Pause" filed Aug. 14, 2020.
U.S. Appl. No. 16/997,659 titled "Apparatuses, Systems, and Methods for Refresh Modes" filed Aug. 19, 2020.
U.S. Appl. No. 17/127,654 titled "Apparatuses and Methods for Row Hammer Based Cache Lockdown" filed Dec. 18, 2020.
U.S. Appl. No. 15/789,897, entitled "Apparatuses and Methods for Refreshing Memory", filed Oct. 20, 2017.
U.S. Appl. No. 15/796,340, entitled: "Apparatus and Methods for Refreshing Memory" filed Oct. 27, 2017.
U.S. Appl. No. 16/012,679, titled "Apparatuses and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/112,471 titled "Apparatuses and Methods for Controlling Refresh Operations" filed Aug. 24, 2018.
U.S. Appl. No. 16/160,801, titled "Apparatuses and Methods for Selective Row Refreshes" filed Oct. 15, 2018.
U.S. Appl. No. 16/231,327 titled "Apparatuses and Methods for Selective Row Refreshes", filed on Dec. 21, 2018.
U.S. Appl. No. 16/237,291, titled "Apparatus and Methods for Refreshing Memory", filed Dec. 31, 2018.
U.S. Appl. No. 15/656,084 title "Semiconductor Device" filed May 14, 2019.
U.S. Appl. No. 16/427,330 titled "Apparatuses and Methods for Storing Victim Row Data" filed May 30, 2019.
U.S. Appl. No. 15/876,566 entitled 'Apparatuses and Methods for Calculating Row Hammer Refresh Addresses In a Semiconductor Device'filed Jan. 22, 2018.
U.S. Appl. No. 15/656,084, titled: Apparatuses and Methods for Targeted Refreshing of Memory, filed Jul. 21, 2017.
U.S. Appl. No. 16/459,520 titled "Apparatuses and Methods for Monitoring Word Line Accesses", filed Jul. 1, 2019.
PCT Application No. PCT/US18/55821 "Apparatus and Methods for Refreshing Memory" filed Oct. 15, 2018.
U.S. Appl. No. 15/715,846, entitled "Semiconductor Device", filed Sep. 26, 2017.
U.S. Appl. No. 15/888,993, entitled "Apparatuses and Methods for Controlling Refresh Operations", filed Feb. 5, 2018.
U.S. Appl. No. 16/190,627 titled "Apparatuses and Methods for Targeted Refreshing of Memory" filed Nov. 14, 2018.
U.S. Appl. No. 15/281,818, entitled: "Semiconductor Device" filed on Sep. 30, 2016.
Kim, et al., "Flipping Bits in MemoryWithout Accessing Them: An Experimental Study of DRAM Disturbance Errors", IEEE, Jun. 2014, 12 pgs.
U.S. Appl. No. 17/324,621 titled "Apparatuses And Methods for Pure-Time, Self-Adopt Sampling for Row Hammer Refresh Sampling" filed May 19, 2021.
U.S. Appl. No. 17/347,957 titled "Apparatuses and Methods for Controlling Steal Rates" filed Jun. 15, 2021.
U.S. Appl. No. 17/186,913 titled "Apparatuses and Methods for Dynamic Refresh Allocation" filed Feb. 26, 2021, pp. all.
[Published as 2020-0219555-A1] U.S. Appl. No. 16/818,981 titled "Apparatuses and Methods for Staggered Timing of Targeted Refresh Operations" filed Mar. 13, 2020.
[Published as 2020-0219556-A1] U.S. Appl. No. 16/824,460, titled "Semiconductor Device Performing Row Hammer Refresh Operation", dated Mar. 19, 2020.

(56) References Cited

OTHER PUBLICATIONS

[Published as US-2020-0005857-A1 ] U.S. Appl. No. 16/025,844, titled "Apparatus and Methods for Triggering Row Hammer Address Sampling", filed Jul. 2, 2018.
[Published as US-2020-0176050-A1] U.S. Appl. No. 16/783,063, titled "Apparatus and Methods for Triggering Row Hammer Address Sampling", dated Feb. 5, 2020.
[Published as US-2020-0211632] U.S. Appl. No. 16/232,837, titled "Apparatuses and Methods for Distributed Targeted Refresh Operations", filed Dec. 26, 2018.
[Published as US-2020-0211634-A1] U.S. Appl. No. 16/818,989, titled "Semiconductor Device Performing Row Hammer Refresh Operation", dated Mar. 13, 2020.
[Published as US-2020-0273517-A1] U.S. Appl. No. 16/286,187 titled "Apparatuses and Methods for Memory Mat Refresh Sequencing" filed on Feb. 26, 2019.
[Published as US-20200294569-A1] U.S. Appl. No. 16/084,119, titled "Apparatuses and Methods for Pure-Time, Self Adopt Sampling for Row Hammer Refresh Sampling", filed Sep. 11, 2018.
[Published as US-2020-0294576-A1] U.S. Appl. No. 16/886,284 titled "Apparatuses and Methods for Access Based Refresh Timing" filed May 28, 2020.
[Published as US-2020-0294576-A1] U.S. Appl. No. 16/886,284, titled "Apparatuses and Methods for Access Based Refresh Timing", dated May 28, 2020.
[Published as US-2020-0321049-A1] U.S. Appl. No. 16/375,716 titled "Apparatuses Timing of Targeted Refresh Operations" filed on Apr. 4, 2019; pp. all.
[Published as US-2020-039563-A1] U.S. Appl. No. 17/008,396 titled "Apparatuses and Methods for Staggered Timing of Targeted Refresh Operations" filed Aug. 31, 2020.
International Search Report and PCT/US2020/026689 dated Jul. 22, 2020.
U.S. Appl. No. 16/788,657, titled "Semiconductor Device Performing Row Hammer Refresh Operation", dated Feb. 12, 2020.
U.S. Appl. No. 16/537,981 titled "Apparatuses and Methods for Controlling Targeted Refresh Rates" filed Aug. 12, 2019.
U.S. Appl. No. 16/655,110 titled "Apparatuses and Methods for Dynamic Targeted Refresh Steals" filed Oct. 16, 2019.
U.S. Appl. No. 16/997,766 titled "Refresh Logic Circuit Layouts Thereof" filed Aug. 19, 2020.
U.S. Appl. No. 17/095,978 titled "Apparatuses and Methods for Controlling Refresh Timing" filed Nov. 12, 2020.
U.S. Appl. No. 17/175,485 titled "Apparatuses and Methods for Distributed Targeted Refresh Operations" filed Feb. 12, 2021.
U.S. Appl. No. 16/176,932, titled "Apparatuses and Methods for Access Based Refresh Timing", filed Oct. 31, 2018.
U.S. Appl. No. 16/208,217, titled "Semiconductor Device Performing Row Hammer Refresh Operation", filed Dec. 3, 2018.
U.S. Appl. No. 16/230,300, titled "Apparatuses and Methods for Staggered Timing of Targeted Refresh Operations" filed Dec. 21, 2018.
U.S. Appl. No. 16/290,730, titled "Semiconductor Device Performing Row Hammer Refresh Operation", filed Mar. 1, 2019.
U.S. Appl. No. 16/374,623, titled "Semiconductor Device Performing Row Hammer Refresh Operation", filed Apr. 3, 2019.
U.S. Appl. No. 16/431,641 titled "Apparatuses and Methods for Controlling Steal Rates" filed Jun. 4, 2019.
U.S. Appl. No. 16/549,411 titled "Apparatuses and Methods for Dynamic Refresh Allocation" filed Aug. 23, 2019.
U.S. Appl. No. 16/682,606, titled "Apparatuses and Methods for Distributing Row Hammer Refresh Events Across a Memory Device", filed Nov. 13, 2019.
U.S. Appl. No. 17/030,018, titled "Apparatuses and Methods for Controlling Refresh Operations", filed Sep. 23, 2020, pp. all.
U.S. Appl. No. 16/432,604 titled "Apparatuses and Methods for Staggered Timing of Skipped Refresh Operations" filed Jun. 5, 2019, pp. all.
U.S. Appl. No. 17/226,975, titled "Apparatuses and Methods for Staggered Timing of Skipped Refresh Operations" filed Apr. 9, 2021. pp. all.
IPRP for International Application No. PCT/US2020/026689, dated Sep. 28, 2021; pp. all.

\* cited by examiner

APPARATUSES AND METHODS FOR STAGGERED TIMING OF TARGETED REFRESH OPERATIONS

CROSS-REFERENCE TO RELATED APPLICATION(S)

This application is a continuation of U.S. patent application Ser. No. 16/375,716 filed Apr. 4, 2019 and issued as U.S. Pat. No. 11,227,649 on Jan. 18, 2022. The aforementioned application is incorporated herein by reference, in its entirety, for any purpose.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto-refresh operation. The targeted refresh operations may occur with timing interspersed between the auto-refresh operations.

DETAILED DESCRIPTION

Figure 1:
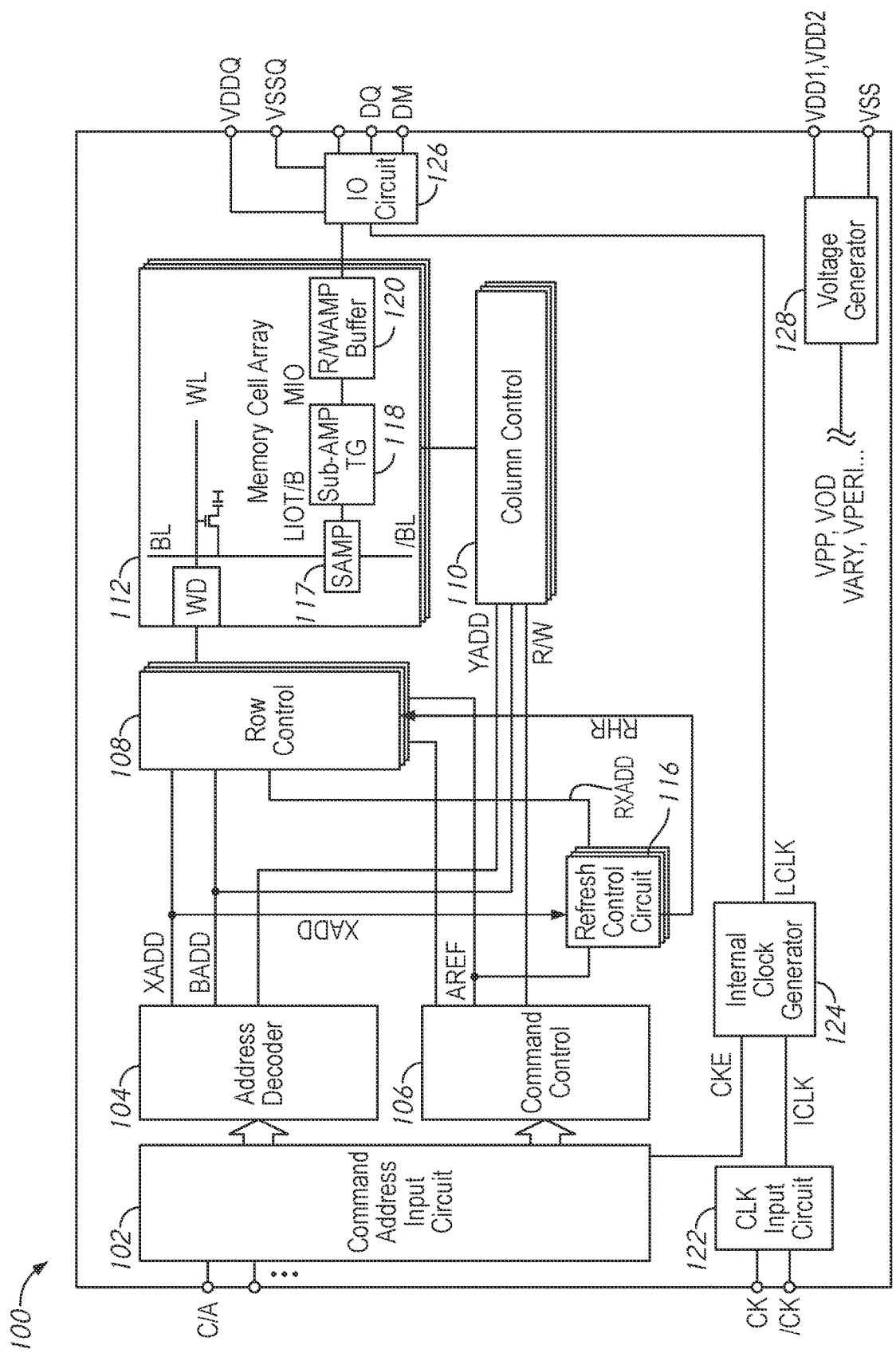
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings Which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a plurality of memory cells. The memory cells may store information (e.g., as one or more bits), and may be organized at the intersection of word lines (rows) and bit lines (columns). A number of word lines and bit lines may be organized into a memory bank. A memory device may include a number of different memory banks. The memory device may receive one or more command signals which may indicate operations in one or more of the banks of one or more memory packages. The memory device may enter a refresh mode, in which wordlines in one or more of the memory banks are refreshed.

Information in the memory cells may decay over time. The memory cells may be refreshed on a row-by-row basis to preserve information in the memory cells. During a refresh operation, the information in one or more rows may be rewritten back to the respective rows to restore an initial value of the information. A refresh signal may control a timing of the refresh operations. Responsive to the refresh signal, the memory banks may be capable of performing more than one type of refresh operation. A first type of refresh operation may simultaneously refresh less rows than the second type of refresh operation. Accordingly, the first type of refresh operation may draw more power than the second type. It may be important to control the amount of power used during refresh operations and reduce the peak amount of power which is drawn.

The present disclosure is drawn to apparatuses, systems, and methods for staggering timing of refresh operations. The memory banks of a device may perform one or more refresh operations synchronized by the activations of the refresh signal. Each memory bank may receive a refresh address which indicates one or more wordlines of the bank, and may then refresh those wordlines. Some of the memory banks may receive refresh addresses Which indicate the second type of refresh operation at different times from each other. In this manner, some of the banks may perform the first type of refresh operations simultaneous to one or more of the banks performing the second type of refresh operation. This may reduce a peak power drawn during the refresh operations on the memory device.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control 108 and the selection of the bit lines BL and /BL is performed by a column control 110. In some embodiments, there may be a row control 108 and column control 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit BL, or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control 106 and to an internal clock generator 124. The internal clock generator 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row control 108 and supplies a decoded column address YADD to the column control 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command control 106 via the command/address input circuit 102. The command control 106 includes circuits to decode the internal command signals to generate various internal signals and commands for performing operations. For example, the command control 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address and a column address are timely supplied with the read command, read data is read from memory cells in the memory array 112 corresponding to the row address and column address. The read command is received by the command control 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control 106 receives a signal which indicates a refresh mode. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh control circuit 116. There may be a refresh control circuit 116 associated with each bank. The refresh control circuits 116 may receive the refresh signal AREF in common, and may generate and provide one or more refresh row address(es) RXADD in order to perform one or more refresh operations in the associated memory bank. In some embodiments, a subset of the memory banks may be given refresh commands. For example, one or more additional signals may indicate which of the refresh control circuits 116 should provide refresh address(es) responsive to AREF. In another example, AREF may only be provided to refresh control circuits 116 which are associated with the subset of memory banks which are refreshing.

Focusing on the operation of a given refresh control circuit, the refresh control circuit 116 supplies a refresh row address RXADD to the row control 108, which may refresh one or more wordlines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

Since the various refresh control circuits are coupled in common to AREF, multiple memory banks of the device 100 may simultaneously perform refresh operations. Each refresh control circuit 116 may be controlled to change details of the refreshing address RXADD (e.g., how the refresh address is calculated, the timing of the refresh addresses), or may operate based on internal logic. The refresh control circuit 116 may direct the associated memory bank to perform different types of refresh operation based on the provided refresh address RXADD.

One type of refresh operation may be an auto-refresh operation. Responsive to an auto-refresh operation the memory bank may refresh a group of rows of the memory, and then may refresh a next group of rows of the memory bank responsive to a next auto-refresh operation. The refresh control circuit 116 may provide a refresh address RXADD which indicates a group of wordlines in the memory bank. The refresh control circuit 116 may generate a sequence of refresh addresses RXADD such that over time the auto-refresh operation may cycle through all the wordlines WL of the memory bank. The timing of refresh operations may be such that each wordline is refreshed with a frequency based on a normal rate of data degradation in the memory cells.

Another type of refresh operation may be a targeted refresh operation. Repeated access to a particular row of memory (e.g., an aggressor row) may cause an increased rate of decay in neighboring rows (e.g., victim rows) due, for example, to electromagnetic coupling between the rows. In some embodiments, the victim rows may include rows which are physically adjacent to the aggressor row. In some embodiments, the victim rows may include rows further away from the aggressor row. Information in the victim rows may decay at a rate such that data may be lost if they aren't refreshed before the next auto-refresh operation of that row. In order to prevent information from being lost, it may be necessary to identify aggressor rows and then carry out a targeted refresh operation where a refresh address RXADD associated with one or more associated victim rows is refreshed.

An auto-refresh operation may draw more power than a targeted refresh operation, since more rows in a given bank may be simultaneously refreshed during an auto-refresh operation than are refreshed during a targeted refresh operation. The different refresh control circuits 116 may provide refresh addresses RXADD such that the different memory banks stagger the targeted refresh and auto-refresh operations in time. For example, a portion of the memory banks performing refresh operations may be performing targeted refresh operations, while simultaneously the remainder of the memory banks performing refresh operations may be performing auto-refresh operations. In some embodiments, the staggering of targeted refresh and auto-refresh operations may be accomplished by having certain memory banks perform a targeted refresh operation responsive to a given occurrence of AREF, while the other memory banks perform an auto-refresh operation.

In some embodiments, the refresh control circuits 116 may perform multiple refresh operations responsive to each occurrence of AREF. Each refresh control circuit 116 may generate a number of 'pumps' (e.g., activations of a pump signal) responsive to receiving an activation of AREF. Each pump, in turn, may cause the refresh control circuit 116 to provide a refresh address RXADD, and trigger a refresh operation as indicated by the refresh address RXADD. A given refresh control circuit 116 may provide auto-refresh addresses responsive to some of the pumps and targeted refresh addresses responsive to some of the pumps generated from a given activation of AREF. In some embodiments, the targeted refresh operations may be staggered between the banks by controlling which pumps are associated with auto-refresh operations and which pumps are associated with targeted refresh operations between the different banks.

Staggering the targeted and auto-refresh operations between the memory banks may help control a power drawn by the memory banks during refresh operations. The amount of power drawn by a refresh operation may be dependent on the number of wordlines which are simultaneously refreshed. If all the memory banks simultaneously performing an auto-refresh operation represents a maximum number of wordlines which can be simultaneously refreshed and all of the memory banks simultaneously performing a targeted refresh operation represents a minimum number of wordlines, then staggering the targeted refresh operations between the banks may, in some embodiments, keep the total number of wordlines which are simultaneously refreshed between the maximum and the minimum. This may both decrease the peak power drawn by a refresh operation (e.g., since less than the maximum number of wordlines are refreshed) and also increase the minimum power drawn during a refresh operation (since more than the minimum number of wordlines are refreshed).

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row control 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 126 so that power supply noise generated by the input/output circuit 126 does not propagate to the other circuit blocks.

Figure 2:
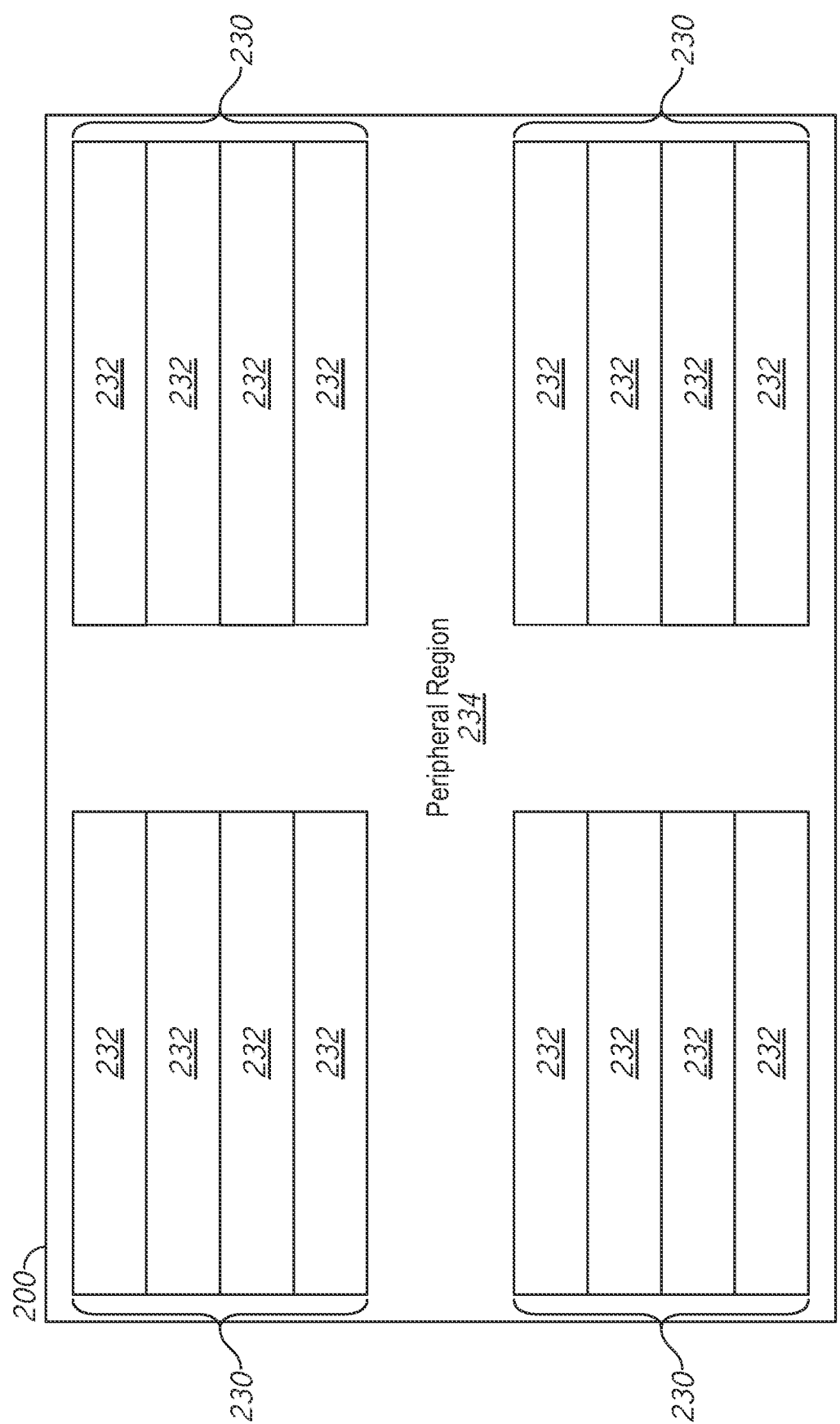
FIG. 2 is a block diagram of a memory array according to an embodiment of the present disclosure.

FIG. 2 is a block diagram of a memory array according to an embodiment of the present disclosure. The memory array 200 may implement the memory array 112 of FIG. 1, in some embodiments. The memory array 200 includes a number of memory banks 232, which are arranged into memory bank groups 230. The memory groups may be physically separated from each other by a peripheral region of the memory device 234. While the example memory device 200 of FIG. 2 includes four groups 230 of four memory banks 232 each (and thus sixteen total memory banks 232) it should be understood that other embodiments may have more or fewer memory banks 232, which may be organized into more or fewer memory groups 230. These banks 232 and/or bank groups 230 may or may not be physically located next to each other.

Each memory bank 232 includes a number of wordlines and bitlines, with a number of memory cells arranged at the intersections. In some embodiments, there may be further organization of the rows (wordlines) and columns (bitlines) within the banks 232. For example, each bank 232 may include a number of memory mats each containing a number of rows and columns. The mats may be organized into mat sets. In some embodiments, during an auto-refresh operation, an address may be provided which causes a wordline in a particular mat of each of the sets in each of the banks 232 to refresh.

In some embodiments, refresh commands may be issued in common to all of the banks 232 and all of the banks 232 may simultaneously perform refresh operations. In some embodiments, a refresh command may be issued which specifies a subset of the banks 232. For example, a particular group (or groups) 230 of banks 232 may begin refreshing. In another example, a portion of the banks 232 in each group 230 (or a subset of the groups) may begin refreshing (e.g., the first bank 232 in each group 230). Once refresh commands have been issued to one or more of the banks 232, each of the indicated banks 232 may simultaneously perform one or more refresh operations. The timing of targeted and auto-refresh operations may be staggered in the indicated banks, such that a portion of the indicated banks perform a targeted refresh operation simultaneous with a portion of the indicated banks performing an auto-refresh operation.

The banks which are refreshing may have logic and/or programming which allows some banks 232 to perform auto-refresh operations while others perform targeted refresh operations. In some embodiments, the logic/programming may be inherent to the design of the memory device rather than being based on settings programmed after the device is assembled.

Each of the banks 232 may be associated with a refresh control circuit (e.g., 116 of FIG. 1), which may issue refresh addresses to that bank 232. Each refresh control circuit may receive activations of AREF and may use an internal logic to determine if the provided refresh address should indicate an auto-refresh operation or a targeted refresh operation. For example, each refresh control circuit may count a number of auto-refresh operations, and perform a targeted refresh operation after a certain number of auto-refresh operations have been performed. The counters in the different refresh control circuits may be initialized to different values, which may stagger the targeted refresh operations across the different banks.

Figure 3:
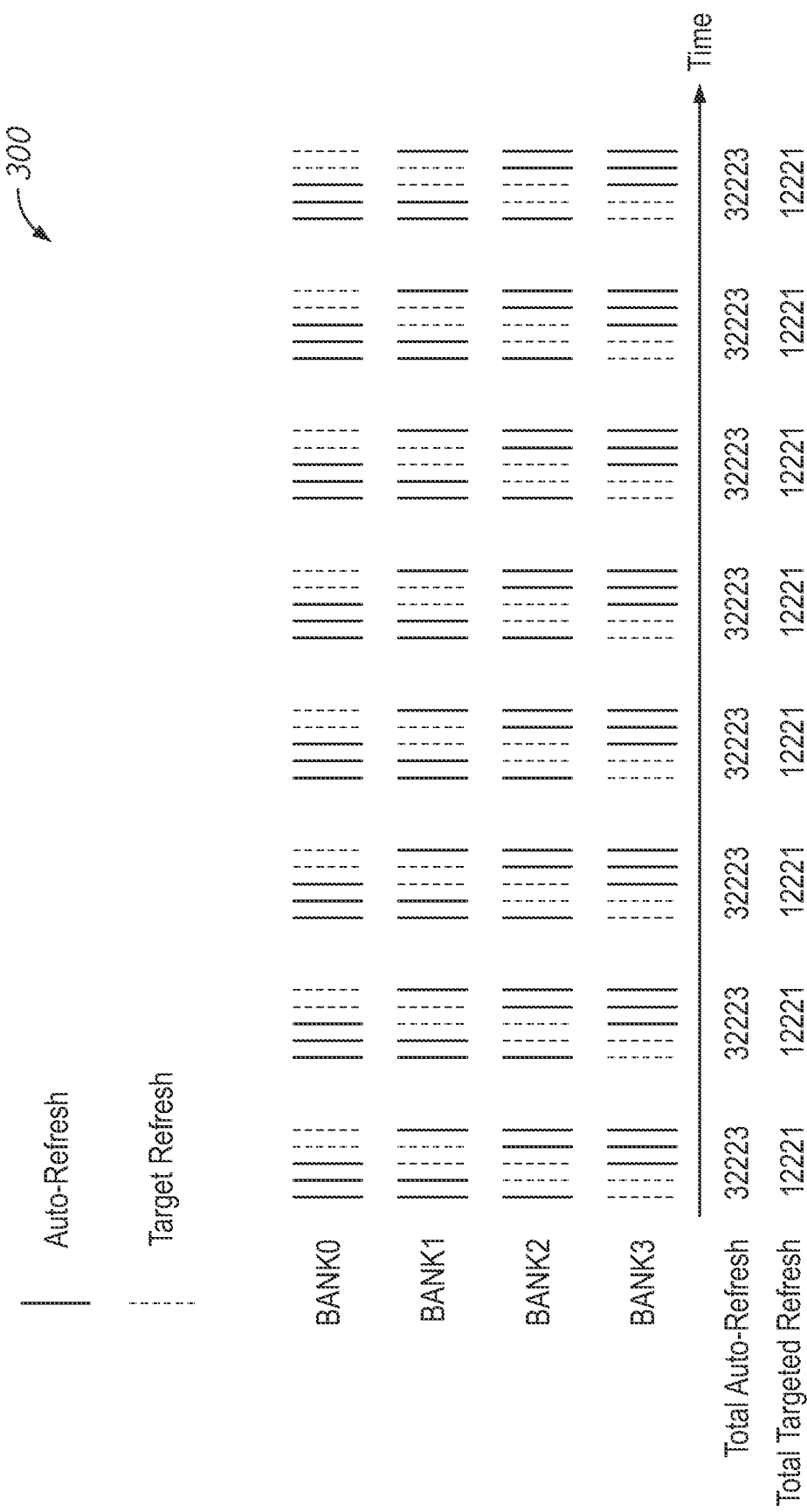
FIG. 3 is a timing diagram of refresh operations in a memory device according to an embodiment of the present disclosure.

FIG. 3 is a timing diagram of refresh operations in a memory device according to an embodiment of the present disclosure. The timing diagram 300 shows refresh operations over time (along the x-axis) for a variety of different memory banks. The memory banks may be the memory banks described as part of memory array 112 of FIG. 1 or memory banks 232 of FIG. 2. The timing diagram 300 shows an example of how targeted refresh operations may be staggered between four different banks (BANK0-BANK3). Other patterns of staggering targeted refresh operations between more or fewer banks may be used in other examples.

The timing diagram 300 shows an example embodiment where five refresh operations are performed responsive to each activation of the refresh signal AREF. In particular, responsive to each activation of AREF, there may be five pumps (e.g., activations of a pump signal in each refresh control circuit), and each of the pumps may be associated with either an auto-refresh operation or a targeted refresh operation. The pumps are represented in timing diagram 300 by the vertical lines. The pumps are in groups of 5 to represent the five pumps per AREF activation. Thus, there is an activation of AREF for each group of pumps. The solid lines represent an auto-refresh operation, while the dashed lines represent a targeted refresh operation. As discussed herein, more wordlines may be simultaneously refreshed in a bank during an auto-refresh operation than during a targeted refresh operation and thus an auto-refresh operation may draw more power than a targeted refresh operation.

A given bank may perform a refresh operation responsive to each of the pumps. Since the banks produce the pumps responsive to a refresh signal (e.g., AREF) that they receive in common, the pumps may generally be synchronized. Thus, each of the banks may simultaneously perform a first pump, then simultaneously perform a second pump, etc. Each of the banks may generally perform auto-refresh operations responsive to the pumps and then may perform a number of targeted refresh operations responsive to a number of pumps, and then repeat the cycle. The targeted refresh operations may be staggered between the banks such that a first bank may begin performing targeted refresh operations at a first time, while a second bank may begin performing targeted refresh operations at a second time different from the first time. In some embodiments, each of the banks may operate on the same cycle of auto and targeted refresh operations (e.g., n auto-refresh operations then m targeted refresh operations) and the only difference may be the phase of the cycle between the different banks.

In the example embodiment of FIG. 3, during a group of pumps (e.g., the five pumps responsive to each AREF activation) for each bank there may be three auto-refresh operations and two targeted refresh operations. For example, the first bank (BANK0) performs 3 auto-refresh operations responsive to the first three pumps, and then two targeted refresh operations on pumps three and four. BANK1 performs targeted refresh operations on pumps three and four. BANK2 performs targeted refresh operations on pumps two and three. BANK3 performs targeted refresh operations on pumps one and two. Note that in the example embodiment of FIG. 3, there is overlap such that a second bank (e.g., BANK2) performs its first targeted refresh operation, while a first bank (e.g., BANK3) simultaneously performs its second targeted refresh operation.

As may be seen from the totals shown below the timing diagram 300, during a first and fifth pump in each group, there may be three auto-refresh pumps and one targeted refresh pump (e.g., first pump: respective auto-refresh pumps for BANK0-2, and one targeted refresh pump for BANK3; fifth pump: respective auto-refresh pumps for BANK1-3, and one targeted refresh pump for BANK0). During the second, third, and fourth pumps in each group, two targeted refresh operations and two auto-refresh operations may be performed. Accordingly, at each simultaneous pump across the different banks, a portion of the banks may perform a targeted refresh operation while the remaining portion performs the auto-refresh operation. For example, there is no point where all four banks simultaneously perform either type of refresh operation.

The banks BANK0-BANK3 of FIG. 3 are shown as having a refresh cycle which is the same length as the number of pumps produced in response to each AREF. In some embodiments, the refresh cycle may be longer or shorter than the number of pumps produced responsive to each AREF. Similarly, the example embodiment of FIG. 3 shows that each group of pumps includes a mix of targeted and auto-refresh operations. In some embodiments, a bank may perform only one type of refresh operations responsive to a given AREF.

In such an embodiment, the different types of refresh operation may be staggered between different activations of AREF rather than between different pumps. For example, responsive to a first activation of AREF, BANK0 may perform a number of pumps, one or more of which is used to perform a targeted refresh operation, while BANKS1-3 may perform a number of pumps each of which is used to perform auto-refresh operations. On a second activation of AREF, BANK1 may perform one or more targeted refresh operations, while BANK0 and BANK2-3 perform auto-refresh operations. On a third activation of AREF, BANK2 may perform one or more targeted refresh operations, while BANK0-1 and BANK3 may perform auto-refresh operations. On a fourth activation of AREF, BANK3 may perform one or more targeted refresh operations, while BANKS0-2 perform auto-refresh operations.

Figure 4:
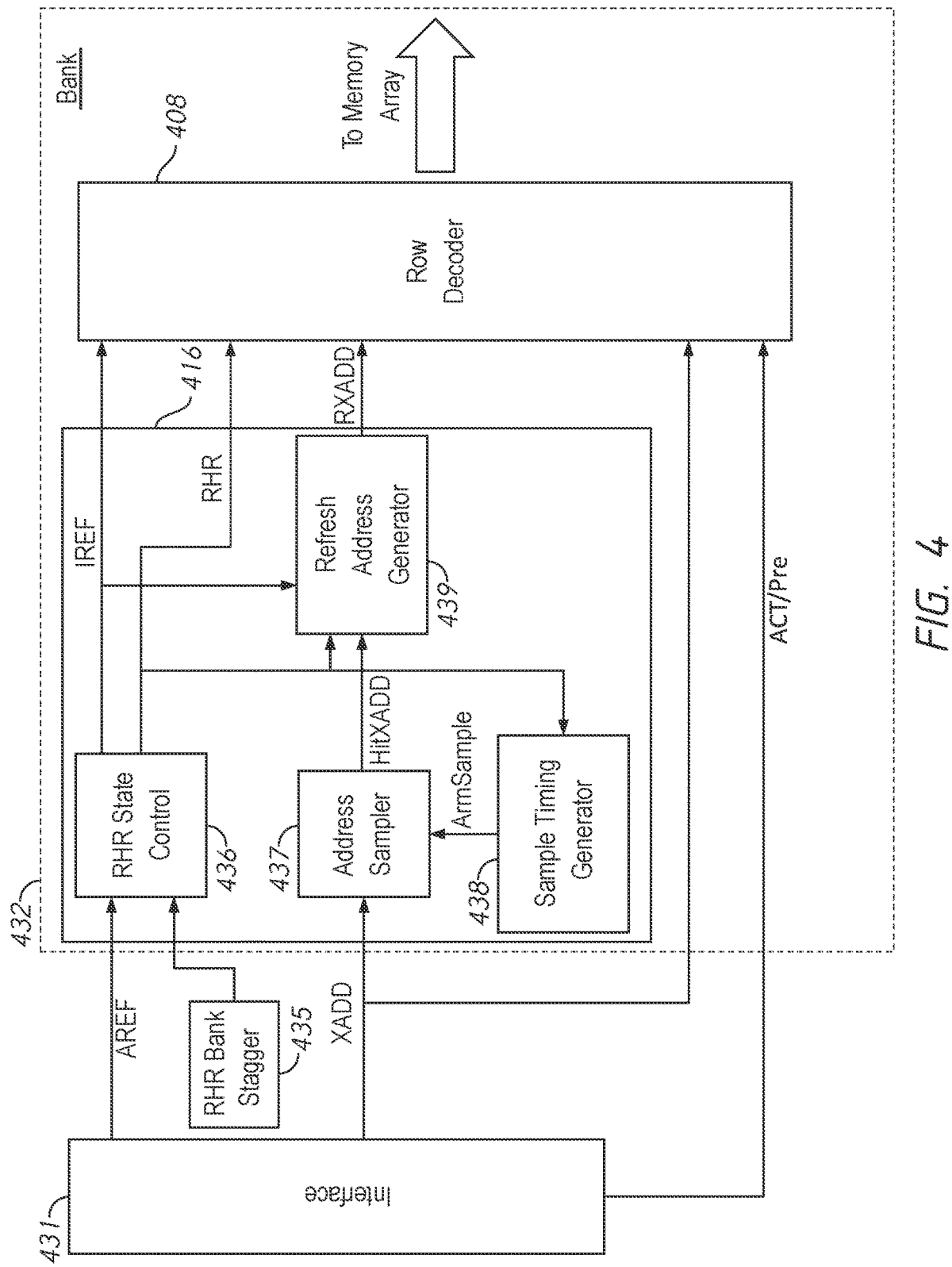
FIG. 4 is a block diagram of a refresh control circuit according to an embodiment of the present disclosure.

FIG. 4 is a block diagram of a refresh control circuit according to an embodiment of the present disclosure. The refresh control circuit 416 may implement the refresh control circuit 116 of FIG. 1 in some embodiments. Certain internal components and signals of the refresh address control circuit 416 are shown to illustrate the operation of the refresh address control circuit 416. The dotted line 432 is shown to represent that in certain embodiments, each of the components (e.g., the refresh address control circuit 416 and row decoder 408) may correspond to a particular bank of memory, and that these components may be repeated for each of the banks of memory. Thus, there may be multiple refresh address control circuits 416 and row decoders 408. For the sake of brevity, only components for a single bank will be described.

An interface 431 may provide one or more signals to an address refresh control circuit 416 and row decoder 408. The refresh address control circuit 416 may include a sample timing generator 438, an address sampler 437, a row hammer refresh (RHR) state controller 436 and a refresh address generator 439. The interface 431 may provide one or more control signals, such as an auto-refresh signal AREF, and a row address XADD. The RHR state control 436 may determine if an auto-refresh or a targeted refresh operation should be performed. The RHR state control circuit 436 may indicate different refresh operations in different banks in order to stagger the targeted and auto-refresh operations between the banks. An RHR bank stagger circuit 435 may control the RHR state control circuit 436 to stagger the targeted and auto-refresh operations.

The refresh address control circuit 416 shows components associated with a particular implementation of detecting aggressor addresses by sampling incoming values of the row address XADD at random or semi-random timing. Other methods of detecting aggressor addresses may be used in other embodiments, and other components may be provided in the refresh address control circuit 416.

The address sampler 437 may sample (e.g., latch) the current row address XADD responsive to an activation of ArmSample. The address sampler 437 may also provide one or more of the latched addresses to the refresh address generator 439 as the matched address HitXADD. The RHR state controller 436 may provide the signal RIM to indicate that a row hammer refresh operation (e.g., a refresh of the victim rows corresponding to an identified aggressor row) should occur. The RHR state controller 436 may also provide an internal refresh signal IREF, to indicate that an auto-refresh operation should occur. The RHR state controller 436 may be used to control the timings of targeted refresh operations and auto-refresh operations. The activations of IREF and RHR may represent activations of the pump signal.

There may be an RHR state controller 436 for each of the different banks. Each RHR state controller 436 may include internal logic which determines the timing with which it provides signals (e.g., RHR) to indicate if a targeted refresh or auto-refresh operation should be performed in the associated bank. In some embodiments, each RHR state controller 436 may include a counter, and may provide the signal RHR based on a number of occurrences of the refresh signal AREF (and/or the number of occurrences of IREF). The counter in each RHR state controller 436 in each of the different banks may initialize to a different value to stagger the refresh operations. Accordingly, each RHR state controller 436 may produce the same pattern of targeted and auto-refresh operations, however those patterns may be out of phase with each other such that they are staggered in time.

In some embodiments and RHR bank stagger circuit 435 may provide a signal to the RHR state control circuits 436 to control the staggering. For example, the RHR bank stagger circuit 435 may provide signals to each of the RHR state control circuit 436 associated with the different banks which may indicate when a targeted refresh operation should be performed. In some embodiments, there may be a single RHR bank stagger circuit 435 which is coupled to all of the refresh address control circuits 416 for the different banks. The RHR bank stagger circuit 435 may contain internal logic (e.g., counters initialized to different values) which allow it to direct the staggering between the different banks.

Responsive to an activation of RHR, the refresh address generator 439 may provide a refresh address RXADD, which may be an auto-refresh address or may be one or more victim addresses corresponding to victim rows of the aggressor row corresponding to the match address HitXADD. The row decoder 408 may perform a refresh operation responsive to the refresh address RXADD and the row hammer refresh signal RHR. The row decoder 408 may perform an auto-refresh operation based on the refresh address RXADD and the internal refresh signal IREF.

In some embodiments, the refresh address control circuit 416 may determine if one or more targeted refresh operations is currently needed, and may provide targeted refresh addresses when a targeted refresh operation is called for. The refresh address control circuits 416 associated with the different banks may each determine a number of targeted refresh operations to perform based on the characteristics of the accesses to the row addresses XADD (e.g., the number, frequency, and/or pattern of accesses). For example, a first refresh address control circuit 416 associated with a first bank containing multiple rows which are hammered may determine that there need to be more targeted refresh operations than a second refresh address control circuit 416 associated with a second bank containing less rows which are hammered. In some embodiments, the refresh operations may occur in cycles (e.g., a certain number of pumps and/or a certain number of AREF occurrences), and the refresh address control circuit 416 may determine a number of targeted refresh operations to perform in each cycle. The remainder of the refresh operations in the cycle may be used for auto-refresh operations or other scheduled operations. Although different banks may determine different numbers of targeted refresh operations to perform, the targeted refresh operations may still be staggered between the different banks.

The interface 431 may represent one or more components which provides signals to components of the bank. For example, the interface 431 may represent components such as the command address input circuit 102, the address decoder 104, and/or the command control 106 of FIG. 1. The interface 431 may provide a row address XADD, the auto-refresh signal AREF, an activation signal ACT, and a pre-charge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal including multiple bits (which may be transmitted in series or in parallel) and may correspond to a specific row of an activated memory bank.

The sample timing generator 438 provides the sampling signal ArmSample. ArmSample may alternate between a low logic level and a high logic level. An activation of ArmSample may be a 'pulse', where ArmSample is raised to a high logic level and then returns to a low logic level. The interval between the pulses of ArmSample may be random, pseudo-random, and/or based on one or more signals of the device (e.g., AREF).

The address sampler 437 may receive the row address XADD from the interface 431 and ArmSample from the sample timing generator 438. The row address XADD may change as the interface 431 directs access operations (e.g., read and write operations) to different rows of the memory cell array (e.g., memory cell array 112 of FIG. 1). Each time the address sampler 437 receives an activation (e.g., a pulse) of ArmSample, the address sampler 437 may sample the current value of XADD. In some embodiments, the address sampler 532 may provide the currently sampled value of XADD as the match address HitXADD. The refresh address generator 439 may provide one or more victim addresses associated with the match address HitXADD as the refresh address RXADD.

In some embodiments, responsive to an activation of ArmSample, the address sampler 437 may determine if one or more rows is an aggressor row based on the sampled row address XADD, and may provide identified aggressor rows as the match address HitXADD. As part of this determination, the address sampler 437 may record (e.g., by latching and/or storing in a register) the current value of XADD responsive to the activation of ArmSample. The current value of XADD may be compared to previously recorded addresses in the address sampler 437 (e.g., the addresses stored in the latch/register), to determine access patterns over time of the sampled addresses. If the address sampler 437 determines that the current row address XADD is being repeatedly accessed (e.g., is an aggressor row), the activation of ArmSample may also cause the address sampler 437 to provide the address of the aggressor row as a match address HitXADD. In some embodiments, the match address (e.g., aggressor address) HitXADD may be stored in a latch circuit for later retrieval by the refresh address generator 439. For example, the value of one or more match addresses HitXADD may be stored until the signal RHR indicates a targeted refresh operation.

The RHR state controller 436 may receive the auto-refresh signal AREF and provide the row hammer refresh signal RHR and the internal refresh signal IREF. The signal RHR may indicate that a targeted refresh operation should take place (e.g., that one or more victim rows associated with the identified aggressor HitXADD should be refreshed). The signal IREF may indicate that an auto-refresh operation should occur. The RHR state controller 436 may use internal logic to provide the RHR signal. In some embodiments, the RHR state controller 436 may include a counter and may provide the RHR signal based on certain number of activations of AREF (e.g., every 4$^{th}$ activation of AREF). The counter may be initialized to a particular value (e.g., when the memory is powered on). The particular value may vary from refresh control circuit to refresh control circuit between banks.

The RHR state controller 436 may also provide an internal refresh signal IREF, which may control the timing of refresh operations. In some embodiments, there may be multiple activations of IREF for each activation of the refresh signal AREF. In some embodiments, the internal refresh signal IREF may be used as a refresh pump signal to control the activations of refresh pumps. In some embodiments, each activation of AREF may be associated with a number of activations of IREF, which may be associated with a number of refresh operations, which may be a mix of targeted refresh operations and auto-refresh operations. For example, each activation of IREF may be associated with a refresh operation on the refresh address RXADD, while the state of RHR may determine if the refresh address RXADD is associated with an auto-refresh operation or a targeted refresh operation. In some embodiments, the signal IREF may be used to indicate that an auto-refresh operation should occur, while the signal RHR is used to indicate that a targeted refresh operation should occur. For example, the signals RHR and IREF may be generated such that they are not active at the same time (e.g., are not both at a high logic level at the same time) and each activation of IREF may be associated with an auto-refresh operation, while each activation of RHR may be associated with a targeted refresh operation.

In some embodiments, the RHR state controller 436 may count activations of IREF and use the count of IREF (e.g., the pumps) to determine when the signal RHR should be provided. Similar to previously described, the counter may initialize to a different value for different refresh control circuits. In some embodiments, the RHR state controller 436 may receive one or more signals from an RHR bank stagger circuit 435, which may direct the different RHR state controllers 436 to provide the signal RHR. In either of these manner targeted and auto-refresh operations may be staggered between banks.

The refresh address generator 439 may receive the row hammer refresh signal RHR and the match address HitXADD. The match address HitXADD may represent an aggressor row. The refresh address generator 439 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 439 may determine the value of the refresh address RXADD based on the row hammer refresh signal RHR. In some embodiments, when the signal RHR is not active, the refresh address generator 439 may provide one of a sequence of auto refresh addresses as the refresh address RXADD. When the signal RHR is active, the refresh address generator 439 may provide a targeted refresh address, such as a victim address, as the refresh address RXADD.

The row decoder 408 may perform one or more operations on the memory array (not shown) based on the received signals and addresses. For example, responsive to the activation signal ACT and the row address XADD (and IREF and RHR being at a low logic level), the row decoder 408 may direct one or more access operations (for example, a read operation) on the specified row address XADD.

Responsive to the RHR signal being active, the row decoder 408 may refresh the refresh address RXADD.

Figure 5:
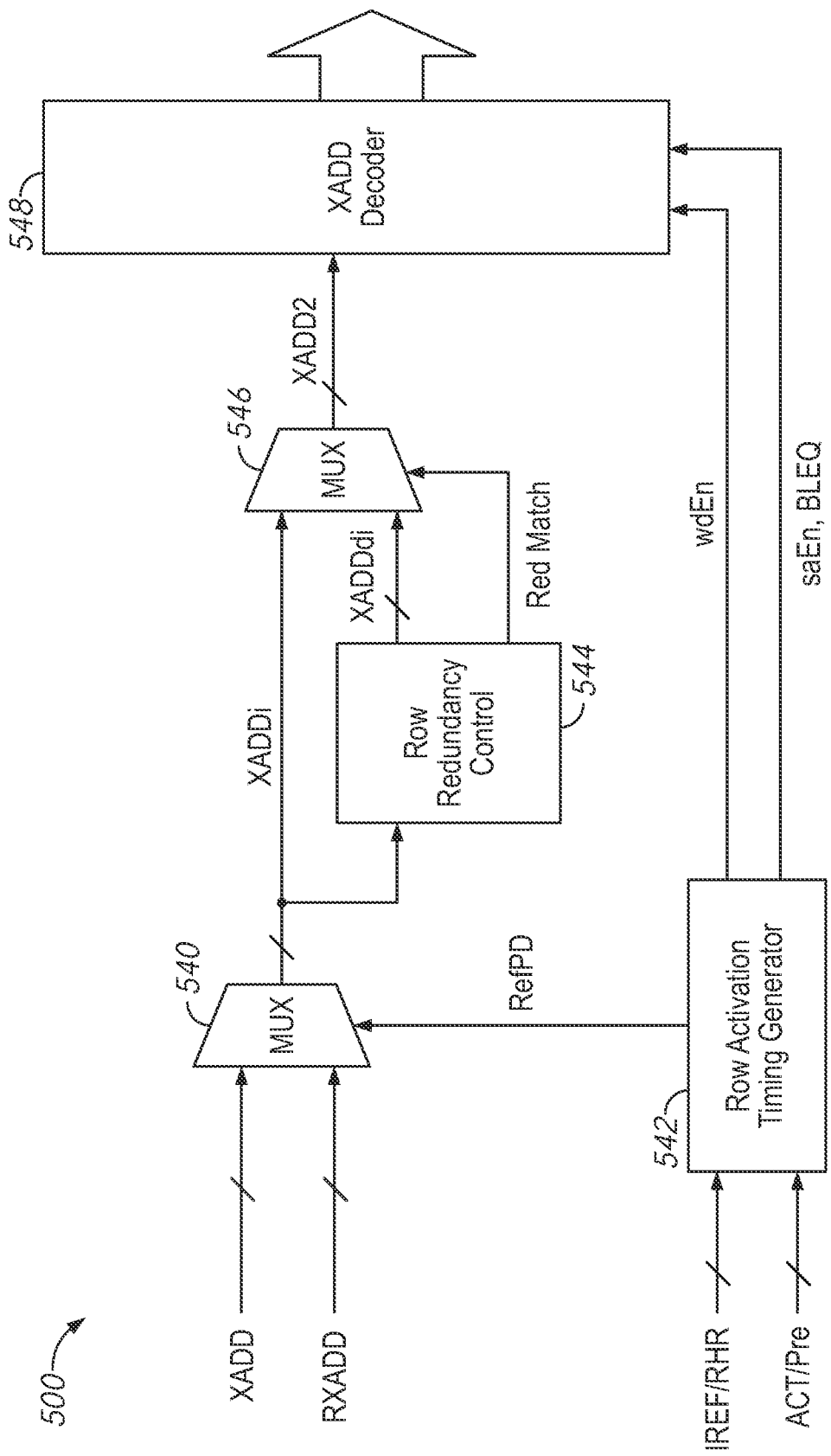
FIG. 5 is a block diagram of a row decoder according to an embodiment of the present disclosure.

FIG. 5 is a block diagram of a row decoder according to an embodiment of the present disclosure. The row decoder 500 may implement the row control 108 of FIG. 1 and/or the row decoder 408 of FIG. 4 in some embodiments of the disclosure. The row decoder 500 may determine whether to activate a word line of the memory bank (e.g., a bank of memory array 112 of FIG. 1) corresponding to the row address XADD or the refresh address RXADD.

As shown in FIG. 5, the row decoder 500 is provided with a row activation timing generator 542, which receives the internal refresh signal IREF and the row hammer refresh signal RHR, the active signal ACT, and the pre-charge signal Pre and provides a state signal RefPD, a word-line actuation signal wdEn, a sense-amplifier actuation signal saEn, and a bit-line equalize signal BLEQ. In some embodiments, the signals IREF and RHR may be the auto-refresh signal AREF. The state signal RefPD is supplied to a multiplexer 540, which selects one of the row address XADD and the refresh address RXADD. An address XADDi selected by the multiplexer 540 is supplied to a row redundancy control circuit 544. If the word line indicated by the address XADDi is replaced by a redundant word line, a hit signal RedMatch is activated, and a row address XADDd1, which is a replacement destination, is generated. The addresses XADDi and XADDd1 are supplied to a multiplexer 546; wherein, if the hit signal RedMatch is not activated, the address XADDi is selected; and, if the hit signal RedMatch is activated, the address XADDd1 is selected. The selected address XADD2 is supplied to an X address decoder 548. The address decoder 548 controls the operation of the word line indicated by the address XADD2, the sense amplifier corresponding thereto, an equalize circuit, etc. based on the word-line actuation signal wdEn, the sense-amplifier actuation signal saEn, and the bit-line equalize signal BLEQ.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in a illustrative manner and are not intended to limit the scope of the appended claims.

What is claimed is:

1. An apparatus comprising:
   a plurality of memory banks, each comprising a plurality of word lines; and
   a plurality of refresh control circuits, each associated with a respective one of the plurality of memory banks, wherein the plurality of refresh control circuits receive a refresh signal in common and each provide a refresh address responsive to the refresh signal, wherein the refresh address is associated with a number of the plurality of word lines, and wherein at least one of the refresh addresses is associated with fewer word lines than a remainder of the refresh addresses.

2. The apparatus of claim 1, further comprising a plurality of row decoders, each configured to refresh an associated one of the plurality of memory banks based on the refresh address.

3. The apparatus of claim 1, wherein the plurality of refresh control circuits are each configured to determine an aggressor address, and wherein the at least one of the refresh addresses associated with the fewer word lines is based on the aggressor address.

4. The apparatus of claim 1, wherein the plurality of refresh control circuits are each configured to provide a plurality of refresh addresses responsive to the refresh signal, each associated with an activation of a pump signal.

5. The apparatus of claim 4, wherein the proportion of refresh addresses associated with the fewer word lines is different during some activations of the pump signal.

6. The apparatus of claim 1, wherein the plurality of refresh circuits are configured to provide the plurality of refresh addresses approximately simultaneously.

7. The apparatus of claim 1, wherein the refresh address associated with the fewer word lines is a targeted refresh address and wherein the remainder of the plurality of refresh addresses are auto-refresh addresses.

8. An apparatus comprising:
   a first memory bank including a first plurality of word lines;
   a second memory bank including a second plurality of word lines;
   a first refresh control circuit associated with the first memory bank, wherein responsive to a refresh signal, the first refresh control circuit is configured to provide a first type of refresh address associated with a first number of wordlines as part of a first type of refresh operation;
   a second refresh control circuit associated with the second memory bank wherein responsive to the refresh signal, the second refresh control circuit is configured to provide a second type of refresh address associated with a second number of word lines as part of a second type of refresh operation, wherein the first type of refresh operation draws less power than the second type of refresh operation.

9. The apparatus of claim 8, wherein the first type of refresh operation is a targeted refresh operation and the second type of refresh operation is an auto-refresh operation.

10. The apparatus of claim 8, wherein the first number of word lines is less than the second number of word lines.

11. The apparatus of claim 8, wherein responsive to the refresh signal the first refresh control circuit is configured to provide the first type of refresh address followed by the second type of refresh address and wherein responsive to the refresh signal the second refresh control circuit is configured to provide the second type of refresh address followed by the first type of refresh address.

12. The apparatus of claim 11, wherein each refresh address is associated with an activation of a pump signal.

13. The apparatus of claim 8, wherein the first refresh control circuit is configured to determine an aggressor address and wherein the first type of refresh address is based on the determined aggressor address.

14. The apparatus of claim 8, further comprising:
   a first row decoder configured to refresh the first number of word lines in the first memory bank responsive to the first type of refresh address; and a second row decoder configured to refresh the second number of word lines in the second memory bank responsive to the second type of refresh address.

15. A method comprising:

receiving a refresh signal at a plurality of refresh control circuits;

generating a plurality of refresh addresses with the plurality of refresh control circuits responsive to the refresh signal, wherein the plurality of refresh addresses includes a first type of refresh address associated with a first number of word lines and a second type of refresh address associated with a second number of wordlines;

refreshing a plurality of banks, based on one or more of the plurality of refresh addresses, wherein refreshing one of the plurality of banks associated with the first type of refresh address draws less power than refreshing one of the plurality of banks associated with the second type of address.

16. The method of claim 15, further comprising determining an aggressor address and generating the first type of refresh address based on the aggressor address.

17. The method of claim 15, wherein responsive to each refresh signal each of the plurality of refresh control circuits provide a plurality of refresh addresses including the first type of refresh address and the second type of refresh address.

18. The method of claim 17, further comprising generating a plurality of activations of a pump signal, and wherein each of the plurality of refresh addresses from one of the plurality of refresh control circuits is associated with one of the plurality of activations of the pump signal.

19. The method of claim 15 further comprising:

refreshing the first type of refresh address as part of a targeted refresh operation; and refreshing the second type of refresh address as part of an auto-refresh operation.

20. The method of claim 15, further comprising refreshing at least one of the plurality of banks based on the first type of refresh address and approximately simultaneously refreshing a remainder of the plurality of banks based on the second type of refresh address.

* * * * *